US008060042B2

(12) United States Patent
Oh et al.

(10) Patent No.: US 8,060,042 B2
(45) Date of Patent: Nov. 15, 2011

(54) METHOD AND AN APPARATUS FOR PROCESSING AN AUDIO SIGNAL

(75) Inventors: Hyen O. Oh, Seoul (KR); Yang Won Jung, Seoul (KR)

(73) Assignee: LG Electronics Inc., Seoul (KR)

( * ) Notice: Subject to any disclaimer, the term of this patent is extended or adjusted under 35 U.S.C. 154(b) by 369 days.

(21) Appl. No.: 12/470,832

(22) Filed: May 22, 2009

(65) Prior Publication Data

US 2009/0325524 A1 Dec. 31, 2009

Related U.S. Application Data

(60) Provisional application No. 61/055,462, filed on May 23, 2008.

(30) Foreign Application Priority Data

May 22, 2009 (KR) ........................ 10-2009-0044743

(51) Int. Cl.
*H03D 5/00* (2006.01)
*H04B 1/18* (2006.01)
*H04R 5/00* (2006.01)

(52) U.S. Cl. ........................... 455/142; 455/293; 381/17

(58) Field of Classification Search .................. 455/142, 455/280, 293, 296, 334; 381/17, 23, 119; 704/203, 501; 327/334
See application file for complete search history.

(56) References Cited

U.S. PATENT DOCUMENTS 7,181,019 B2 * 2/2007 Breebaart et al. ............... 381/23
2006/0009225 A1 * 1/2006 Herre et al. ................... 455/450
(Continued)

FOREIGN PATENT DOCUMENTS

EP 1909265 A2 4/2008
(Continued)

OTHER PUBLICATIONS

Samsudin; Kurniawati E; NG Boon Poh; Sattar F; George F; "A Stereo to Mono Dowmixing Scheme for MPEG-4 Parametric Stereo Encoder" Acoustics, Speech and Signal Processing, 2006, ICASSP 2006 Proceedings. 2006 IEEE International Conference on Toulouse, France May 14-19, 2006, Piscataway, NJ, USA, Jan. 1, 2006, pp. V-V, XP031101562.

*Primary Examiner* — Nguyen Vo
(74) *Attorney, Agent, or Firm* — Birch, Stewart, Kolasch & Birch, LLP

(57) ABSTRACT

A signal processing apparatus and method thereof are disclosed. The present invention includes receiving a low frequency downmix signal including a multi channel signal, phase shift information and spatial information corresponding to parameter band of the low frequency downmix signal, generating the multi channel signal by applying the spatial information based on the parameter band to a whole frequency downmix signal, generating estimated phase shift information of a parameter band by using the phase shift information, and generating a phase shift multi channel signal by shifting a phase of the multi channel signal based on the phase shift information and the estimated phase shift information. Accordingly, it is able to efficiently reproduce a phase or delay difference, which is difficult to be efficiently reproduced by a decorrelator, in a manner of shifting a phase of a decoded audio or speech signal based on phase shift information. And, a phase shift is enabled to fit each parameter band of a multi channel signal with raised coding efficiency.

15 Claims, 8 Drawing Sheets

U.S. PATENT DOCUMENTS

| | | | | |
|---|---|---|---|---|
| 2006/0133618 | A1* | 6/2006 | Villemoes et al. | 381/20 |
| 2006/0246868 | A1* | 11/2006 | Taleb et al. | 455/303 |
| 2007/0255572 | A1* | 11/2007 | Miyasaka et al. | 704/500 |
| 2007/0271095 | A1 | 11/2007 | Miyasaka et al. | |
| 2010/0085102 | A1* | 4/2010 | Lee et al. | 327/334 |

FOREIGN PATENT DOCUMENTS

| | | | |
|---|---|---|---|
| WO | WO-03/007656 | A1 | 1/2003 |
| WO | WO-2005/086139 | A1 | 9/2005 |
| WO | WO 2006/022124 | A1 | 3/2006 |

* cited by examiner

METHOD AND AN APPARATUS FOR PROCESSING AN AUDIO SIGNAL

CROSS-REFERENCE TO RELATED APPLICATION

This application claims the benefit of U.S. Provisional Application No. 61/055,462, filed on May 23, 2008, KR Application No. P2009-0044743, filed on May 22, 2009, which are hereby incorporated by reference.

BACKGROUND OF THE INVENTION

1. Field of the Invention

The present invention relates to an apparatus for processing a signal and method thereof which is suitable for improving a signal sound quality using a signal generated from shifting a phase of an inputted signal.

2. Discussion of the Related Art

Generally, it is able to code a signal by means of decorrelator in order to generate a stereo signal from a mono signal.

However, in case of generating a speech signal using a decorrelator, the decorrelator is unable to precisely reproduce a phase or delay difference existing between channel signals.

SUMMARY OF THE INVENTION

Accordingly, the present invention is directed to an apparatus for processing a signal and method thereof that substantially obviate one or more of the problems due to limitations and disadvantages of the related art.

An object of the present invention is to provide an apparatus for processing a signal and method thereof, by which a sound quality can be enhanced in a manner of shifting a phase of a decoded audio or speech signal using phase shift information.

Additional features and advantages of the invention will be set forth in the description which follows, and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, a method of processing a signal includes receiving a low frequency downmix signal including a multi channel signal, phase shift information and spatial information corresponding to parameter band of the low frequency downmix signal, generating the multi channel signal by applying the spatial information based on the parameter band to a whole frequency downmix signal, the whole frequency downmix signal including the low frequency downmix signal and a reconstructed high frequency downmix signal from the low frequency downmix signal, generating estimated phase shift information corresponding to a parameter band by using the phase shift information, the parameter band being not corresponded to the phase shift information, and generating a phase shift multi channel signal by shifting a phase of the multi channel signal based on the phase shift information and the estimated phase shift information.

Preferably, the phase shift multi channel signal is shifted by the parameter band of channel of the multi channel signal.

Preferably, the estimated phase shift information is generated by interpolation and smoothing in a frequency domain based on a number of the parameter band and the phase shift information.

Preferably, the phase shift information includes at least one of phase values corresponding to the parameter band.

Preferably, the generating the multi channel signal includes generating interpolated spatial information on a time unit of the whole frequency downmix signal by interpolating the spatial information in a time domain, the time unit being not corresponding to the spatial information, applying the spatial information and the interpolated spatial information to the whole frequency downmix signal.

Preferably, the phase shift multi channel signal is shifted the phase of a right channel of the multi channel signal by $\pi/2$.

Preferably, the phase shift multi channel signal is shifted the phased of at least one channel by a same phase for a whole frequency band.

Preferably, the whole band downmix signal is reconstructed by using the entire or a portion of the low frequency downmix signal.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE INVENTION

Reference will now be made in detail to the preferred embodiments of the present invention, examples of which are illustrated in the accompanying drawings. First of all, terminologies in the present invention can be construed as the following references. And, terminologies not disclosed in this specification can be construed as the following meanings and concepts matching the technical idea of the present invention. Therefore, the configuration implemented in the embodiment and drawings of this disclosure is just one most preferred embodiment of the present invention and fails to represent all technical ideas of the present invention. Thus, it is understood that various modifications/variations and equivalents can exist to replace them at the timing point of filing this application.

First of all, it is understood that the concept 'coding' in the present invention includes both encoding and decoding.

Secondly, 'information' in this disclosure is the terminology that generally includes values, parameters, coefficients, elements and the like and its meaning can be construed as different occasionally, by which the present invention is non-limited. Stereo signal is taken as an example for a signal in this disclosure, by which examples of the present invention are non-limited. For example, a signal in this disclosure may include a multi-channel signal having at least three or more channels.

Figure 1:
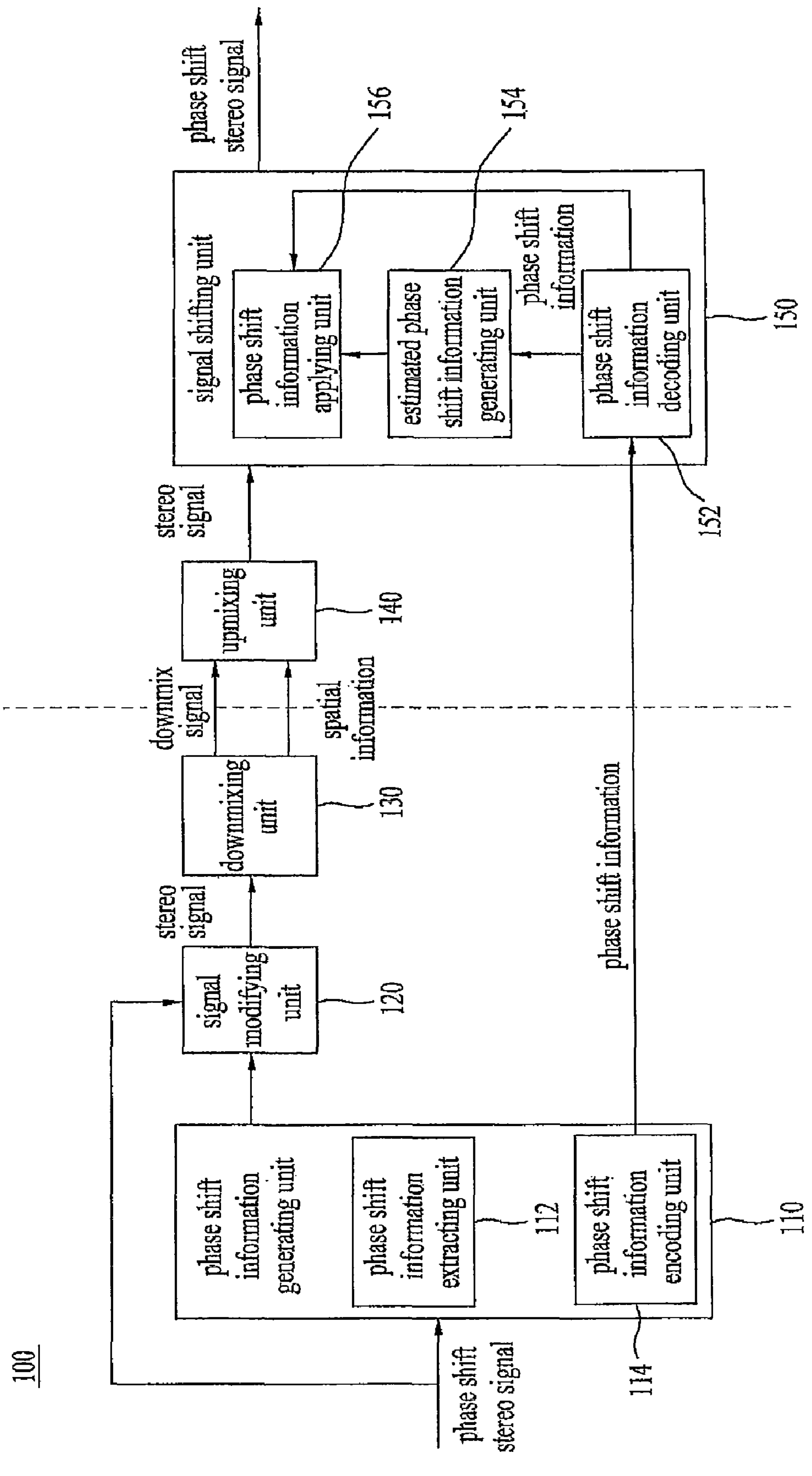
FIG. 1 is a schematic block diagram of a signal coding apparatus according to one embodiment of the present invention.

FIG. 1 shows a signal coding apparatus 100 according to one embodiment of the present invention.

Referring to FIG. 1, a signal encoding apparatus 100 includes a phase shift information generating unit 110, a signal modifying unit 120, a downmixing unit 130, an upmixing unit 140 and a signal shifting unit 150.

First of all, the phase shift information generating unit 110 generates phase shift information by receiving an input of a phase shift stereo signal. And, the phase shift information generating unit 110 includes a phase shift information extracting unit 112 and a phase shift information encoding unit 114. In this case, the phase shift stereo signal can include a signal having at least one out-of-phase channel signal (L', R'). The phase shift information extracting unit 112 generates the phase shift information from the phase shift stereo signal by estimating an extent of a phase to be shifted to generate an in-phase channel signal of the inputted phase shift stereo signal. In particular, the phase shift information can be variably determined per predetermined frequency range or time range by measuring a delay based on cross-correlation information of the phase shift stereo signal. Thereafter, the extracted phase shift information is encoded by the phase shift information encoding unit 114 and is then transferred.

The phase shift information can include flag information (phase_shift_flag) indicating that a phase of the stereo signal has been shifted and is able to further include information relevant to a phase-shifted extent, a phase-shifted channel signal, a phase-shift occurring frequency band, a frame corresponding to a phase shift and/or time information, etc. as well as the flag information.

First of all, in case that the phase shift information indicates flag information (phase_shift_flag) only, it is able to generate the stereo signal in a manner that a phase of the phase shift stereo signal is shifted using a fixed value. For instance, it is able to generate the stereo signal by shifting a phase in a manner that right and left channels become orthogonal to each other by decreasing a phase of a right channel of the phase shift stereo signal by $\pi/2$ or increasing a phase of a left channel thereof by $\pi/2$. Instead of being limited to the $\pi/2$ phase shift, it is able to generate the stereo signal by shifting a phase to enable the right and left channels to become orthogonal to each other.

In doing so, it is able to generate the stereo signal by equally applying the shifted phase to whole frequency bands of the phase shift stereo signal. Moreover, instead of transferring information indicating that a phase of at least one channel of the phase shift stereo signal is modified by $\pi/2$ or information on a phase shifted to become orthogonal, it is able to use information preset in a decoder side later, by which the present invention is non-limited.

On the contrary, if there are at least two fixed values used for the phase shift per parameter band, it is able to generate the stereo signal by applying the at least two fixed values to a range of a preset parameter band.

Besides, the phase shift information can further include detail information associated with a phase shift as well as the flag information (phase_shift_flag). In this case, the detailed information can include a phase shift extent, a phase-shifted channel signal, a phase-shift occurring frequency band and phase-shift occurring time information. And, it is able to determine the phase shift extent by measuring a delay based on cross-correlation information of the phase shift stereo signal inputted to the phase shift information extracting unit 112.

Meanwhile, the phase shift information can variably indicate a shifted extent of a phase of a multi-channel signal per frame. In case that the phase shift information includes the flag information only, it is able to indicate whether a phase is shifted per frame. In case that the phase shift information includes flag information and detail information on a phase shift, the detail information can indicate a shifted extent of a phase per subband or can indicate a shifted extent of a phase on a corresponding time variably per predetermined time range.

The signal modifying unit 120 generates a stereo signal (L, R) by receiving an input of a phase shift stereo signal (L', R') and an input of phase shift information and then shifting to modify a phase of the phase shift stereo signal.

For instance, if the phase shift stereo signal (L', R') is a signal having at least one out-of-phase channel signal, the stereo signal (L, R) may be an in-phase signal provided by modifying the phases of the out-of-phase signals. On the other hand, if the phase shift stereo signal (L', R') is an in-phase signal, it is able to generate a stereo signal having a modified characteristic of a sound source in a manner that the signal modifying unit 120 intentionally modifies a phase of the phase shift stereo signal. Although the method of modifying a phase to enable an out-of-phase phase shift stereo signal to become an in-phase signal and generating phase shift information is mentioned in the foregoing description, an in-phase signal is intentionally shifted to become an out-of-phase signal and it is then able to generate phase shift information corresponding to the out-of-phase signal.

The downmixing unit 130 receives an input of the stereo signal and is then able to generate a downmix signal and spatial information. In this case, the stereo signal can include a multi-channel signal having at least three channels and the downmix signal can include a stereo downmix signal or a downmix signal having at least three channels.

And, the downmixing unit 130 is able to generate spatial information indicating attributes of the stereo signal. In this case, the spatial information is provided for a decoder to decode the downmix signal into the stereo signal and can include channel level difference (CLD) information, channel prediction coefficient, inter-channel correlation (ICC) information, etc.

Moreover, a bitstream generating unit (not shown in the drawing) is able to generate one bitstream containing the downmix signal, the spatial information and the phase shift information.

Meanwhile, an input signal configuring the downmix signal is not limited to the stereo signal but can include a multi-object signal constructed with at least one object signal. In this case, it is understood that the spatial information is the information on the multi-object signal.

The upmixing unit 140 is able to generate a stereo signal by upmixing the downmix signal using the spatial information. In this case, the 'upmixing' means that an upmixing matrix is applied to generate a channel signal having channels more than those of the downmix signal. And, an upmixed signal means a signal to which the upmixing matrix is applied. Therefore, the stereo signal is the signal having channels more than those of the downmix signal. The stereo signal can be the signal itself to which the upmixing matrix is applied. The stereo signal can be a QMF-domain signal being generated to have a plurality of channels by having the upmixing matrix applied thereto. And, the stereo signal can be a final signal being generated from converting the QMF-domain signal to a time-domain signal.

The signal shifting unit 150 generates a phase shift stereo signal by shifting a phase of at least one channel of the stereo signal using the stereo signal and the phase shift information. And, the signal shifting unit 150 includes a phase shift information decoding unit 152, an estimated phase shift information generating unit 154 and a phase shift information applying unit 156.

The phase shift information decoding unit 152 decodes the received phase shift information. The decoded phase shift information can include the information applied to a whole frequency of the stereo signal or the information applied to a partial parameter band. In this case, the phase shift information can include the information in the QMF domain and the stereo signal can be a QMF-domain signal, by which the present invention is non-limited.

The phase shift information decoded by the phase shift information decoding unit 154 can just contain flag information (phase_shift_flag) indicating whether a phase of the stereo signal is shifted. In this case, the phase shift information can be variably contained per frame or parameter band and its meaning is illustrated in Table 1.

TABLE 1

| Phase_shift_flag | Meaning |
|---|---|
| 1 | Phase shift information is applied to a stereo signal. |
| 0 | Phase shift information is not applied to a stereo signal. |

In case that the phase shift information (phase_shift_flag) indicates that phase shift information is applied to the stereo signal, the estimated phase shift information generating unit 154 does not generate estimated phase shift information using the phase shift information but the phase shift information applying unit 156 is able to reconstruct a phase shift stereo signal by applying the phase shift information (i.e., a fixed phase shift value) to the stereo signal in direct. For instance, it is able to increase or decrease at least one channel of the stereo signal by π/2 or it is able to shift a phase to enable the stereo signal to become orthogonal. In this case, a value preset in a decoder is used as the 'π/2' or a size of the phase shifted for orthogonality and is not separately measured and transferred by an encoder. Meanwhile, the phase shift information can variably indicate an extent that a phase of the multi-channel signal is shifted per frame. In case that the phase shift information includes flag information only, it is able to indicate whether a phase of a stereo signal is shifted per frame.

In this case, it is able to generate the phase shift stereo signal by identically applying the 'π/2' or a size of the phase shifted for orthogonality to a whole frequency of the stereo signal. If a size of the shifted phase is set per parameter band of each channel signal, it is able to generate the phase shift stereo signal by applying the size of the shifted phase per parameter band having been set.

Secondly, in case that the phase shift information further contains detailed information relevant to a phase shift as well as the flag information (phase_shift_flag), it is able to reconstruct a phase shift stereo signal using the detail information. In this case, the detail information contains a phase-shifted extent, a phase-shifted channel signal, a phase-shifted frequency band, time information corresponding to a phase shift and the like and is able to further contain information for their inverse transforms. And, the phase-shifted extent may be determined using a delay based on cross-correlation information of a phase shift stereo signal inputted to an encoder.

In case that the phase shift information contains flag information and detail information on a phase shift, the detail information is able to variably indicate a phase-shifted extent per subband or parameter band or a phase-shifted extent in a time per predetermined time range.

In case that the phase shift information contains the detail information on the phase shift as well as the flag information, the estimated phase shift information generating unit 142 further generates estimated phase shift information on a parameter band of the stereo signal, to which the phase shift information does not correspond, using the phase shift information. And, its details will be explained with reference to FIGS. 2A to 3B later.

The phase shift information applying unit 156 generates a phase shift stereo signal by applying the phase shift information and the estimated phase shift information to the stereo signal generated by the upmixing unit 140.

By means of further using the phase shift information and the estimated phase shift information for the upmixed stereo signal in addition to spatial information, it is able to efficiently reproduce a phase difference, a delay difference and the like, which are difficult to be reconstructed due to a loss occurrence in case of decoding the downmix signal using the spatial information only, and it is also able to improve a sound quality.

Figure 2A:
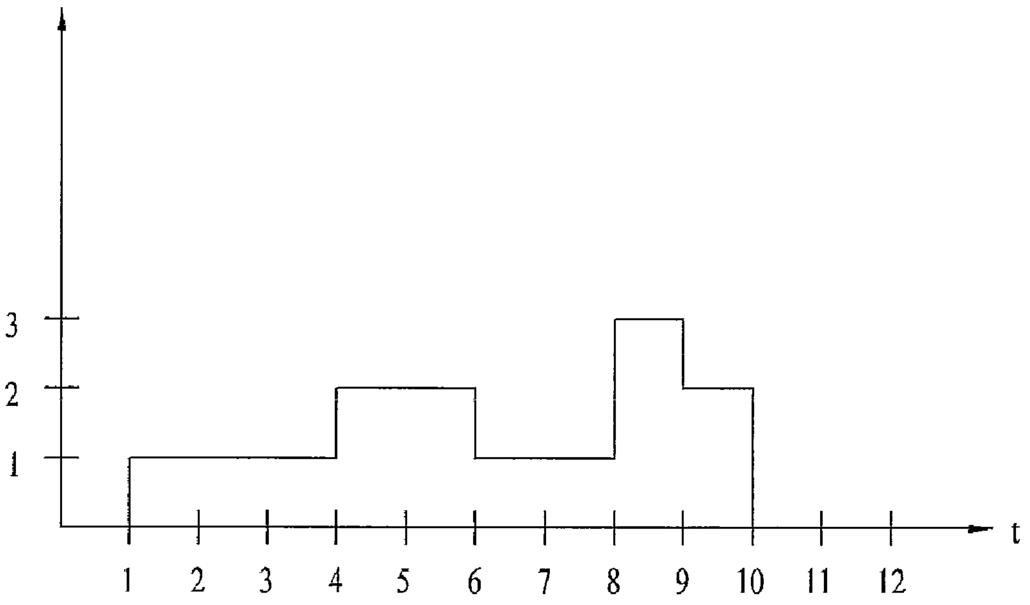
FIG. 2A and FIG. 2B are schematic diagrams for a method of smoothing spatial information according to one embodiment of the present invention.
Figure 2B:
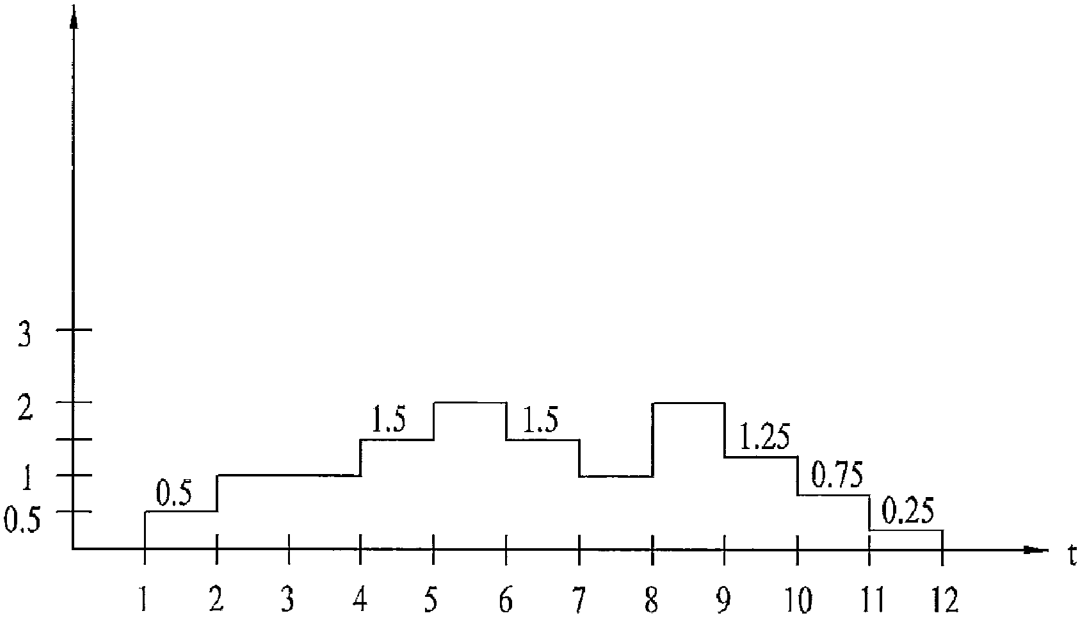

FIG. 2A and FIG. 2B illustrate spatial information through estimation. In this disclosure, 'estimation' includes interpolation performed on information corresponding to a non-received unit using neighbor information and smoothing performed to reduce a size difference of information and the like by adjusting a quantization level or the like. Meanwhile, it is able to raise coding efficiency by transferring spatial information, which corresponds to a partial time slot among time slots that are units on time, to a decoding device only. In this case, the decoding device is able to perform interpolation on a time slot, in which corresponding spatial information fails to be received, using the received spatial information.

FIG. 2A shows that spatial information corresponding to all time slots (or, time units) is generated through interpolation. Spatial information being interpolated into a time domain (before smoothing) has a big difference per time slot, whereby a sound quality may be degraded. Therefore, spatial information needs to be smoothed by a method of downsizing a quantization level interval or the like.

FIG. 2B shows a size of smoothed spatial information.

Referring to FIG. 2B, it can be observed that each size of time units 1, 4, 6, 8 and 9 is increased or decreased more than that shown in FIG. 2A to result in a change of a step-like size. And, it can be also observed that a peak between time units 8 and 9 is decreased. Such a decrease of a peak or a step-like size change brings an effect of improving a sound quality of a reconstructed signal.

Figure 3A:
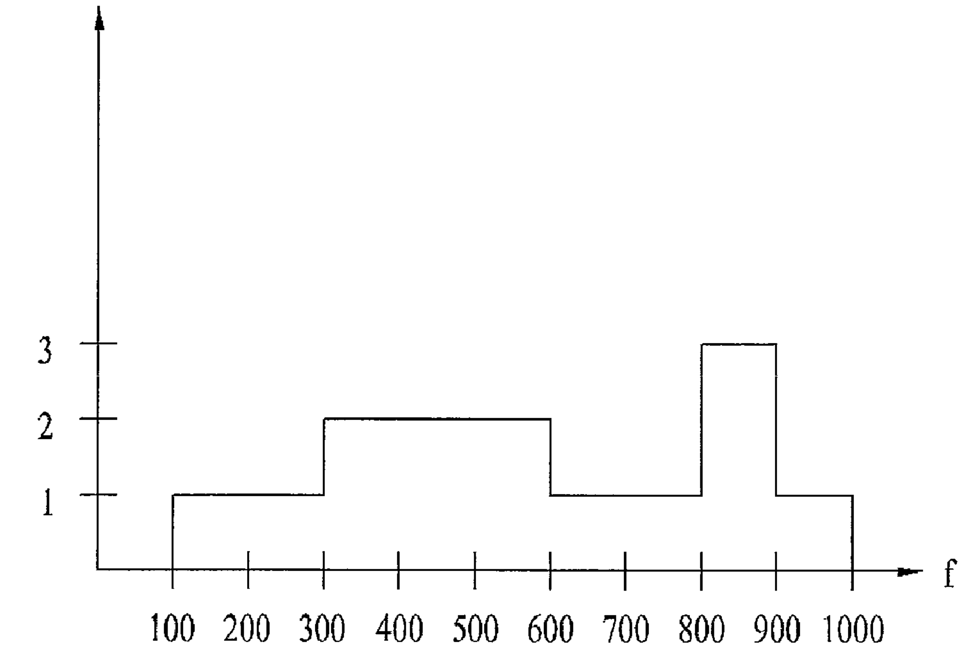
FIG. 3A and FIG. 3B are schematic diagrams for a method of generating estimated phase shift information according to one embodiment of the present invention.
Figure 3B:
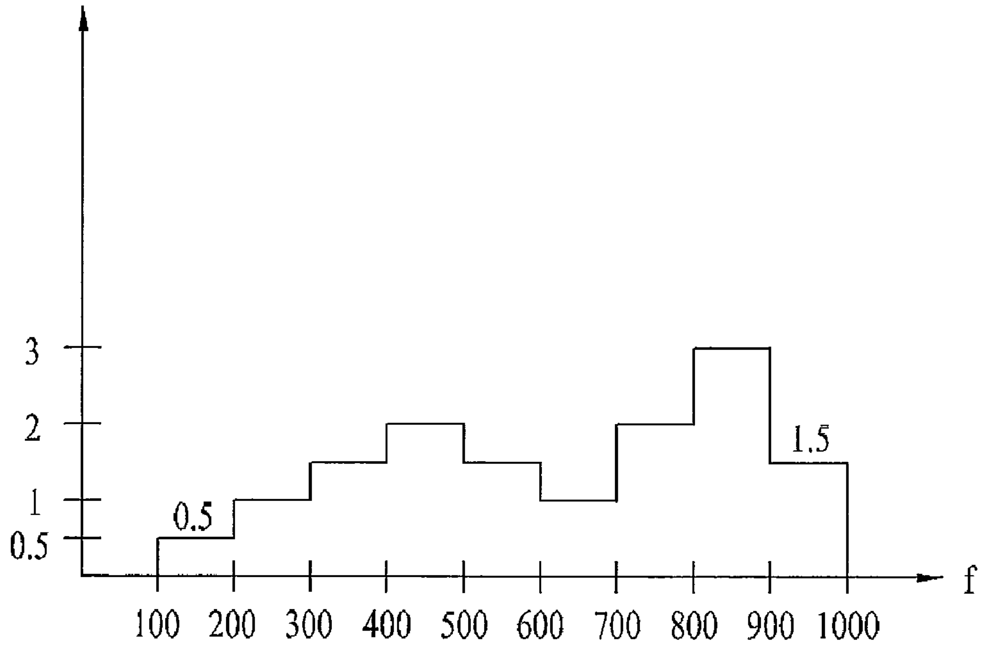

FIG. 3A and FIG. 3B show estimated phase shift information in a frequency domain. Unlike spatial information, phase shift information can be interpolated and smoothed into a frequency domain.

Referring to FIG. 3A, it is able to raise coding efficiency by transferring phase shift information, which corresponds to a partial parameter band among parameter bands that are frequency units, to a decoding device only. In this case, the decoding device is able to generate estimated phase shift information by performing interpolation on a parameter band, on which corresponding phase shift information fails to be received, using the received phase shift information.

FIG. 3A shows that estimated phase shift information corresponding to all parameter bands (or frequency units) is generated through interpolation. Phase shift information interpolated into a frequency domain (before smoothing) has a big difference per parameter band, whereby a sound quality may be degraded. Therefore, a step of smoothing phase shift information by a method of downsizing a quantization level interval or the like is necessary.

FIG. 3B shows a size of estimated phase shift information generated by smoothing and a size of phase shift information.

Referring to FIG. 3B, it can be observed that a peak between parameter band units 200 and 300 and a peak between parameter band units 700 and 800 are decreased. Thus, it is able to reduce a sound quality loss of a phase shift stereo signal which is reconstructed as phase shift information is increased or decreased per parameter band step by step or gradually. Moreover, phase shift information is received per parameter band and estimated phase shift information is generated and applied. Therefore, since the phase shift information is variably applicable per parameter band using a substantially shifted phase, it is able to reconstruct a phase shift stereo signal more finely.

Figure 4:
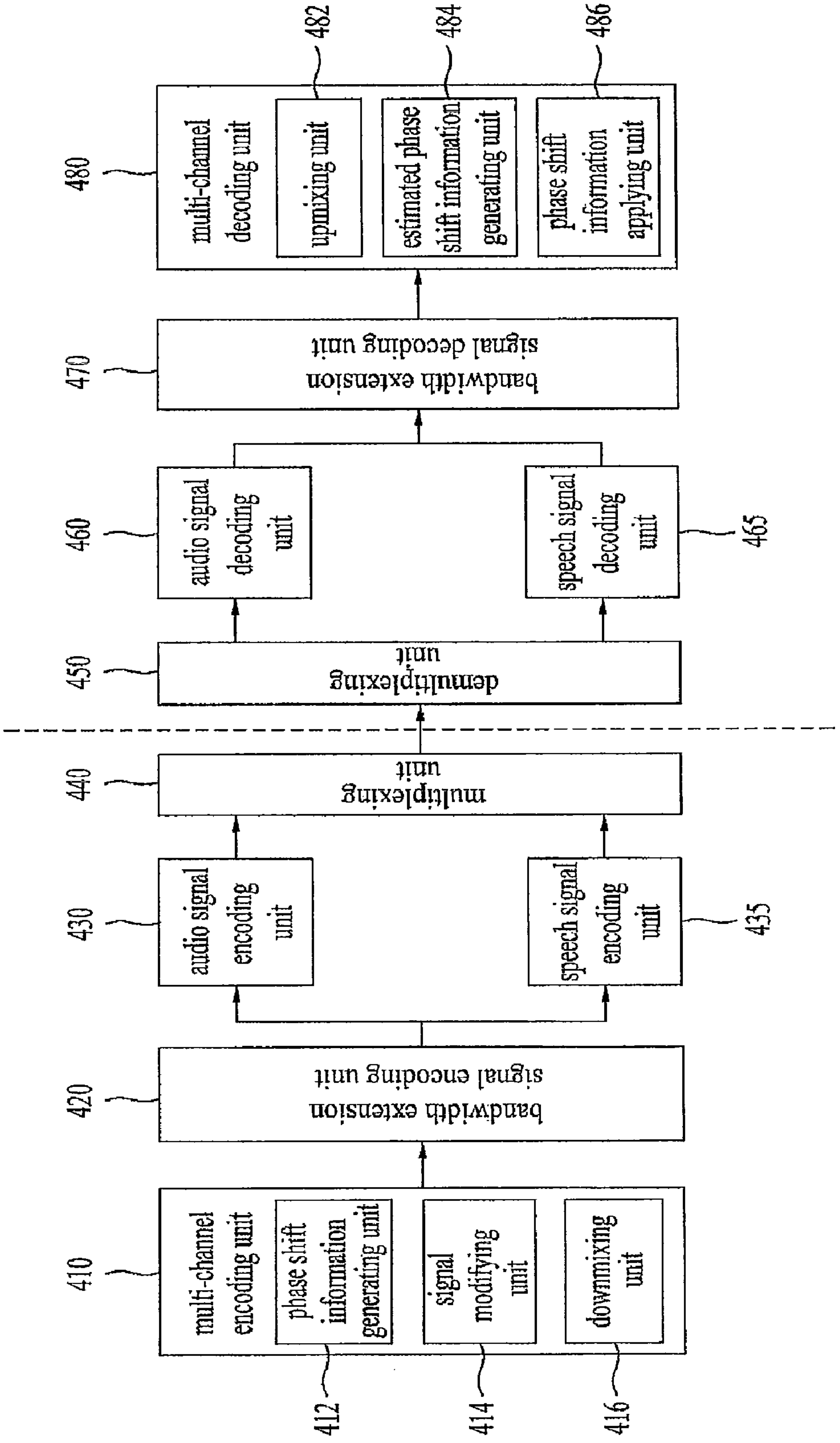
FIG. 4 is a schematic block diagram of a signal coding apparatus according to another embodiment of the present invention.

FIG. 4 shows a signal processing apparatus 400 according to another embodiment of the present invention.

Referring to FIG. 4, a signal processing apparatus 400 according to another embodiment of the present invention mainly includes a multi-channel encoding unit 410, a bandwidth extension signal encoding unit 420, an audio signal encoding unit 430, a speech signal encoding unit 435, a multiplexing unit 440, a demultiplexing unit 450, an audio signal decoding unit 460, a speech signal decoding unit 465, a bandwidth extension signal decoding unit 470 and a multi-channel decoding unit 480.

First of all, a downmix signal, which is generated by the multi-channel encoding unit 410 from downmixing a stereo signal, is named a whole frequency downmix signal. And, a downmix signal, which has a low frequency signal only as a high frequency signal is removed from the whole frequency downmix signal, is named a low frequency downmix signal.

The multi-channel encoding unit 410 receives an input of a stereo signal. The multi-channel encoding unit 410 generates a whole frequency downmix signal by downmixing the inputted stereo signal and also generates spatial information corresponding to the stereo signal. In this case, the spatial information can contain channel level difference information, channel prediction coefficient, inter-channel correlation information, downmix gain information, etc.

In case that an input signal is an out-of-phase phase shift stereo signal, the multi-channel encoding unit 410 according to one embodiment of the present invention generates a stereo signal and phase shift information by modifying a phase and is then able to transfer them together with the spatial information. Alternatively, the multi-channel encoding unit 410 just generates and transfers phase shift information to enable a decoder side to shift a phase without modifying a phase of the input signal. This is as good as described with reference to FIG. 1 and its details are omitted. Hence, the multi-channel encoding unit 410 includes a phase shift information generating unit 412, a signal modifying unit 414 and a downmixing unit 416. As theses units have the same configurations and functions of the former units having the same names shown in FIG. 1, their details will be omitted in the following description.

The bandwidth extension signal encoding unit 420 receives the whole frequency downmix signal and is then able to generate extension information corresponding to a high frequency signal in the whole frequency downmix signal. In this case, the extension information is the information for enabling a decoder side to reconstruct a low frequency downmix signal resulting from removing a high frequency signal into the whole frequency downmix signal. And, the extension information can be transferred together with the spatial information.

It is determined whether a downmix signal will be coded by an audio signal coding scheme or a speech signal coding scheme based on a signal characteristic. And, mode information for determining the coding scheme is generated [not shown in the drawing]. In this case, the audio coding scheme may use MDCT (modified discrete cosine transform), by which the present invention is non-limited. And, the speech coding scheme may follow the AMR-WB (adaptive multi-rate wideband) standard, by which the present invention is non-limited.

The audio signal encoding unit 430 encodes the low frequency downmix signal, from which the high frequency signal is removed, according to the audio signal coding scheme using the extension information and the whole frequency downmix signal inputted from the bandwidth extension signal encoding unit 420.

A signal coded by the audio signal coding scheme can include an audio signal or a signal having a speech signal partially included in an audio signal. And, the audio signal encoding unit 430 may include a frequency-domain encoding unit.

The speech signal encoding unit 435 encodes a low-frequency downmix signal, from which a high frequency signal is removed, according to a speech signal coding scheme using the extension information and the whole frequency downmix signal inputted from the bandwidth extension signal encoding unit 420.

The signal encoded by the speech signal coding scheme can include a speech signal or an audio signal partially contained in a speech signal. The speech signal encoding unit 435 is able to further use linear prediction coding (LPC) scheme. If an input signal has high redundancy on a time axis, modeling can be performed by linear prediction for predicting a current signal from a past signal. In this case, if the linear prediction coding scheme is adopted, coding efficiency can be raised. Meanwhile, the speech signal encoding unit 435 can include a time-domain encoding unit.

The multiplexing unit 440 generates a bitstream to transfer using an encoded audio or speech signal and spatial information including phase shift information and extension information.

The demultiplexing unit 450 is able to separate all signals received from the multiplexing unit 440. The demultiplexing unit 450 may receive a signal encoded according to at least one of an audio coding scheme and a speech coding scheme. This signal can include phase shift information, extension information and a low frequency downmix signal as well as spatial information.

The audio signal decoding unit 460 decodes a signal according to an audio signal coding scheme. The signal inputted to and decoded by the audio signal decoding unit 460 can include an audio signal or a signal having a speech signal partially included in an audio signal. And, the audio signal decoding unit 460 can include a frequency-domain decoding unit and is able to use IMDCT (inverse modified discrete coefficient transform).

The speech signal decoding unit 465 decodes a signal according to a speech signal coding scheme. The signal decoded by the speech signal decoding unit 465 can include a speech signal or a signal having an audio signal partially included in a speech signal. The speech signal decoding unit 465 can include a time-domain decoding unit and is able to further use linear prediction coding (LPC) scheme.

The bandwidth extension decoding unit 470 receives the low frequency downmix signal, which is the signal decoded by the audio signal decoding unit 460 or the speech signal decoding unit 465, and the extension information and then generates a whole frequency downmix signal of which signal corresponding to the high-frequency region having been removed in encoding is reconstructed.

It is able to generate the whole frequency downmix signal using entire portion of the low frequency downmix signal and the extension information or using the low frequency downmix signal in part.

The multi-channel decoding unit 480 includes an upmixing unit 482, an estimated phase shift information generating unit 484 and a phase shift information applying unit 486.

At first, the upmixing unit 482 receives the whole frequency downmix signal, the spatial information and the phase shift information and then generates a stereo signal by applying the spatial information to the whole frequency downmix signal. And, the estimated phase shift information generating unit 484 generates estimated phase shift information on a parameter band, on which corresponding phase shift information is not received, using the phase shift information.

Subsequently, the phase shift information applying unit 486 reconstructs a phase shift stereo signal by applying the phase shift information and the estimated phase shift information to a parameter band of a corresponding stereo signal. Details of this process are described in detail with reference to FIG. 1 and are omitted in the following description.

Thus, in a signal processing method and apparatus according to the present invention, a phase shift stereo signal is generated by applying phase shift information and estimated phase shift information to a stereo signal reconstructed using the multi-channel decoding unit 480, whereby a phase or delay difference difficult to be reproduced by a related art multi-channel decoder can be effectively reproduced.

Figure 5:
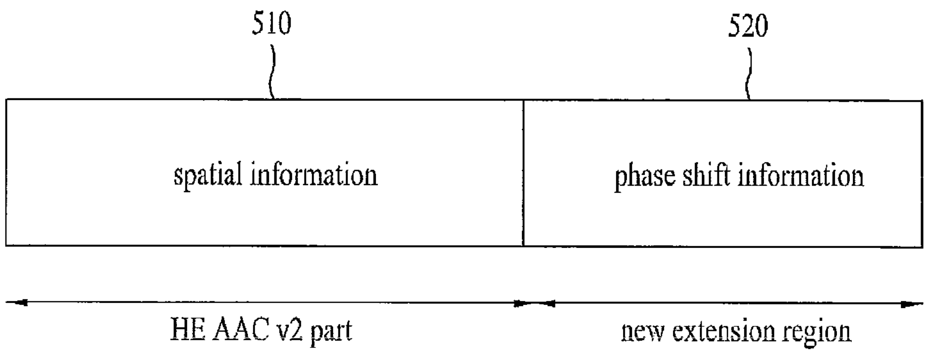
FIG. 5 is a diagram for a structure of a bitstream according to one embodiment of the present invention.

FIG. 5 shows an example structure of a bitstream according to the present invention.

Referring to FIG. 5, spatial information 510 is the information that is essentially transferred, while phase shift information 520 is selectively usable. The phase shift information 520 is contained in a new extension region additionally located at a tail portion of a conventional bitstream.

The phase shift information 520 is not decodable by such a decoding device as HE AAC v2 but is decodable by a decoding device capable of supporting a new extension region. Therefore, the phase shift information 520 has backward compatibility.

Moreover, the phase shift information of the present invention is usable by a multi-channel encoding unit 410 and a multi-channel decoding unit 480 of a signal processing apparatus for coding a speech signal and/or an audio signal by an appropriate scheme.

Figure 6:
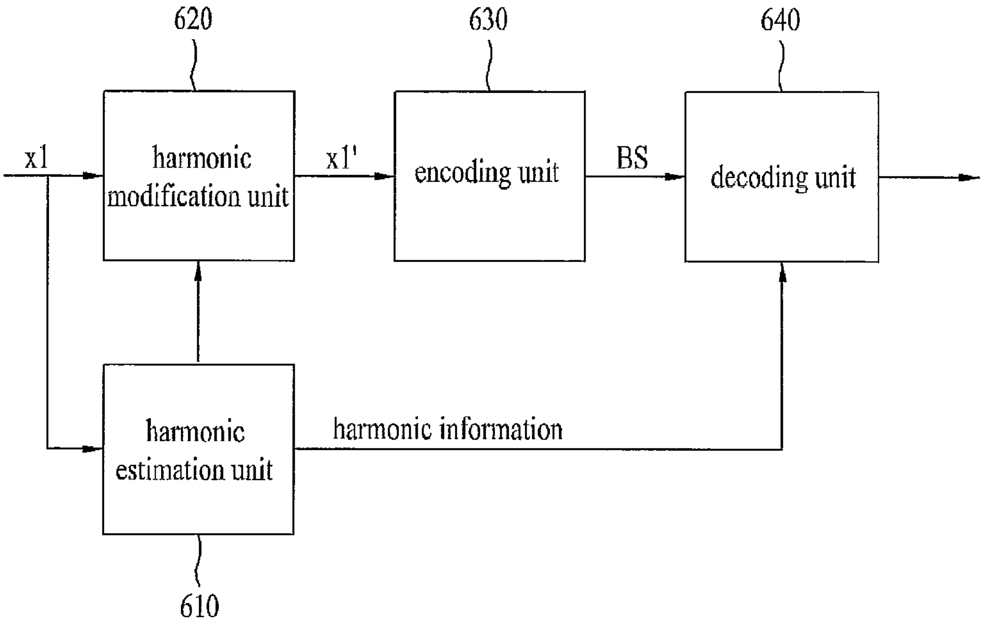
FIG. 6 is a block diagram of a signal coding apparatus according to a further embodiment of the present invention.

FIG. 6 is a block diagram of a signal processing apparatus 600 according to a further embodiment of the present invention.

Referring to FIG. 6, a signal processing apparatus 600 includes a harmonic estimation unit 610, a harmonic modification unit 620, an encoding unit 630 and a decoding unit 640.

First of all, the harmonic estimation unit 610 receives an input of a stereo signal (or, a multi-channel signal, X1) and is then able to generate harmonic information indicating a time unit of a harmonic component of the stereo signal, a position on a parameter band unit of the harmonic component, a size of the harmonic component and the like. In this case, the harmonic component can include a pitch component of an input signal.

Such a coding device, which uses conventional LTP (long-term prediction), as AAC-LTP adopts a scheme of coding a residual signal from which a harmonic component (or, a pitch component) is removed using LTP. Yet, since a character of a sound source in a speech or audio signal may be determined according to a characteristic of a harmonic component (or, a pitch component), it is preferable that the harmonic component (or, the pitch component) is preserved well.

Hence, the harmonic modification unit 620 generates a harmonic modification stereo signal X1' by modifying an input signal using the harmonic information in order to further emphasize a harmonic component estimated by the harmonic estimation unit 610 instead of using the conventional LTP. For instance, it is able to generate a harmonic modification stereo signal X1' by emphasizing a harmonic component in a frequency domain or a signal corresponding to pitch information in a time domain, which can be calculated by Formula 1.

$$x1(n)' = x1(n) + g * x1(n-D) \quad \text{[Formula 1]}$$

In Formula 1, D is a pitch delay and g is a gain. Generally, it is $g<0$ in LTP. Yet, in Formula 1, g is a positive number. In particular, g preferably corresponds to $0<g<1$.

The encoding unit 630 receives an input of the harmonic modification stereo signal X1', of which harmonic or pitch component is emphasized, and then generates a downmix signal and spatial information by encoding the input by the method for the multi-channel encoding unit 410 shown in FIG. 4.

Subsequently, the decoding unit 640 is able to reconstruct a stereo signal using the spatial information, the harmonic information and the downmix signal. Moreover, the harmonic information generated by the harmonic estimation unit 610 is inputted to the harmonic modification unit 620 only but may not be transferred to the decoding unit 640. If the harmonic information is not transferred to the decoding unit 640, a stereo signal is decoded using inputted spatial information and a downmix signal only.

Figure 7:
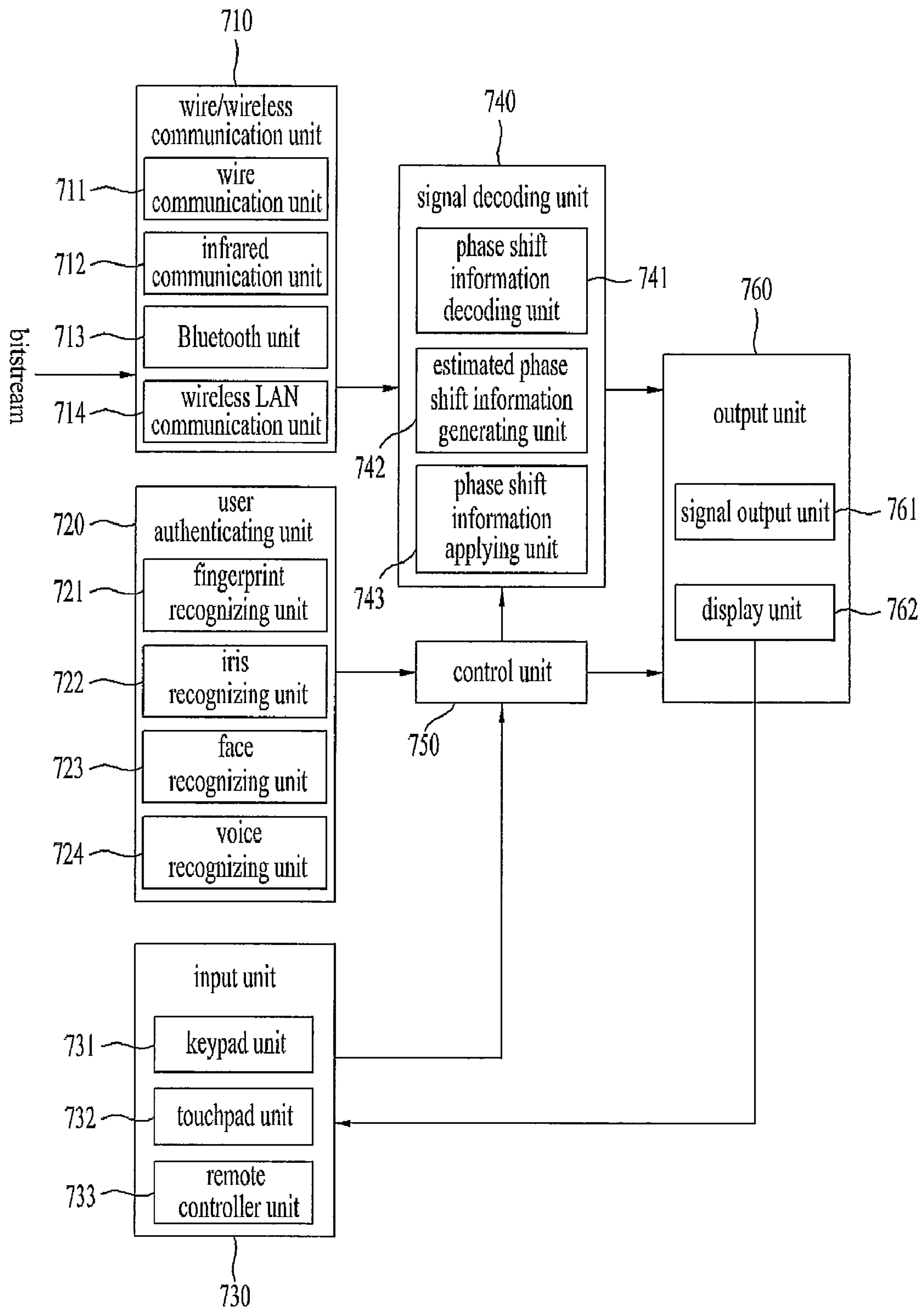
FIG. 7 is a schematic diagram of a configuration of a product including a phase shift decoding unit, an estimated phase shift information generating unit and a phase shift information applying unit according to a further embodiment of the present invention.
Figure 8A:
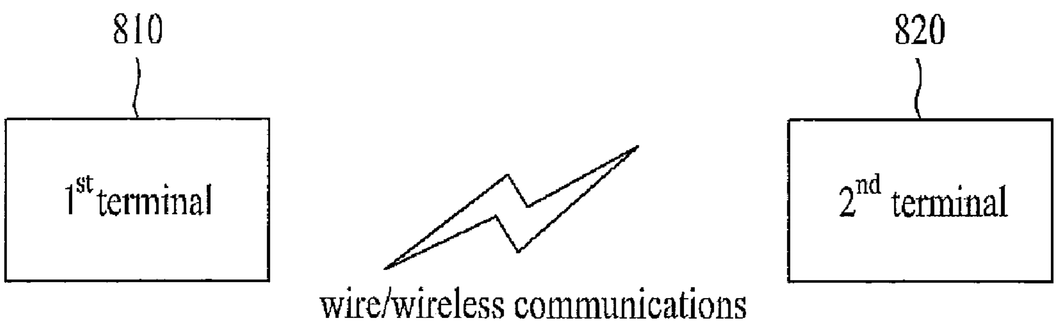
FIG. 8A and FIG. 8B are schematic diagrams for relations of products including a phase shift decoding unit, an estimated phase shift information generating unit and a phase shift information applying unit according to a further embodiment of the present invention, respectively.
Figure 8B:
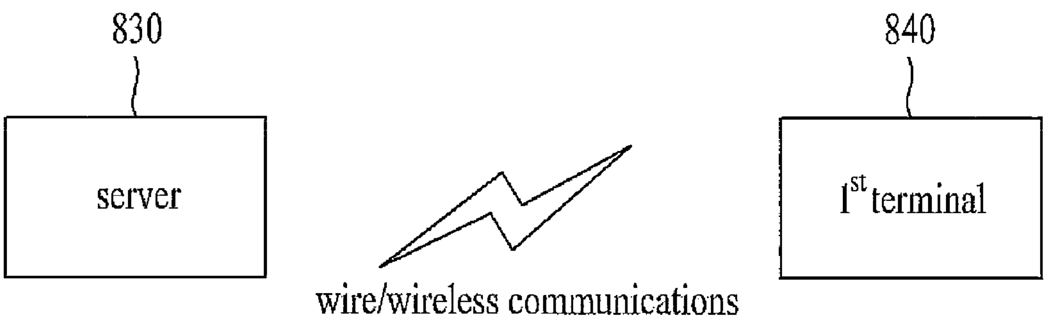

FIG. 7 is a schematic diagram of a configuration of a product including a phase shift decoding unit, an estimated phase shift information generating unit and a phase shift information applying unit according to one embodiment of the present invention, and FIG. 8A and FIG. 8B are schematic diagrams for relations of products including a phase shift decoding unit, an estimated phase shift information generating unit and a phase shift information applying unit according to an embodiment of the present invention, respectively.

Referring to FIG. 7, a wire/wireless communication unit 710 receives a bitstream by wire/wireless communications. In particular, the wire/wireless communication unit 710 includes at least one of a wire communication unit 711, an infrared communication unit 712, a Bluetooth unit 713 and a wireless LAN communication unit 714.

A user authenticating unit 720 receives an input of user information and then performs user authentication. The user authenticating unit 720 can include at least one of a fingerprint recognizing unit 721, an iris recognizing unit 722, a face recognizing unit 723 and a voice recognizing unit 724. In this case, the user authentication can be performed in a manner of receiving an input of fingerprint information, iris information, face contour information or voice information, converting the inputted information to user information, and then determining whether the user information matches registered user data.

An input unit 730 is an input device for enabling a user to input various kinds of commands. And, the input unit 730 can include at least one of a keypad unit 731, a touchpad unit 732 and a remote controller unit 733, by which examples of the input unit 730 are non-limited. Meanwhile, if preset metadata for a plurality of preset informations outputted from a phase shift information decoding unit 741, which will be explained later, are displayed on a screen via a display unit 762, a user is able to select the preset metadata via the input unit 730 and information on the selected preset metadata is inputted to a control unit 750.

A signal decoding unit 740 includes a phase shift information decoding unit 741, an estimated phase shift information generating unit 742 and a phase shift information applying unit 743.

First of all, the phase shift information decoding unit 741 decodes received phase shift information. In this case, the phase shift information can include flag information (phase_shift_flag) only or can further include detailed information. Moreover, the phase shift information can be variable per frame or parameter band. If the phase shift information is variable per parameter band, the estimated phase shift information generating unit 742 generates estimated phase shift information on a parameter band, on which corresponding phase shift information is not received, using the former phase shift information.

Subsequently, the phase shift information applying unit 743 generates a phase shift stereo signal, in which a phase of a corresponding parameter band of at least one channel of a stereo signal has been shifted, by applying the phase shift information and the estimated phase shift information to an already-upmixed stereo signal using spatial information. They have the same configurations and functions of the former units having the same names shown in FIG. 1 and their details will be omitted in the following description.

A control unit 750 receives input signals from the input devices and controls all processes of the signal decoding unit 740 and an output unit 760. As mentioned in the foregoing description, if such a user input as on/off of a phase shift of an output signal, an input/output of metadata, on/off operation of a signal decoding unit and the like is inputted to the control unit 750 from the input unit 730, the control unit decodes a signal using the user input.

And, an output unit 760 is an element for outputting an output signal and the like generated by the signal decoding unit 740. The output unit 760 can include a signal output unit 761 and a display unit 762. If an output signal is an audio signal, it is outputted via the signal output unit 761. If an output signal is a video signal, it is outputted via the display unit 762. Moreover, if metadata is inputted to the input unit 730, it is displayed on a screen via the display unit 762.

FIG. 8A and FIG. 8B show relations between terminals or between a terminal and a server, to which the product shown in FIG. 7 pertains.

Referring to FIG. 8A, it can be observed that bidirectional communications of data or bitstreams can be performed between a first terminal 810 and a second terminal 820 via wire/wireless communication units. In this case, the data or bitstream exchanged via the wire/wireless communication unit may have the structure of the former bitstream of the present invention shown in FIG. 5 or may include the former data including the phase shift information, the estimated phase shift information and the like of the present invention described with reference to FIGS. 1 to 6.

Referring to FIG. 8B, it can be observed that wire/wireless communications can be performed between a server 830 and a first terminal 840.

Figure 9:
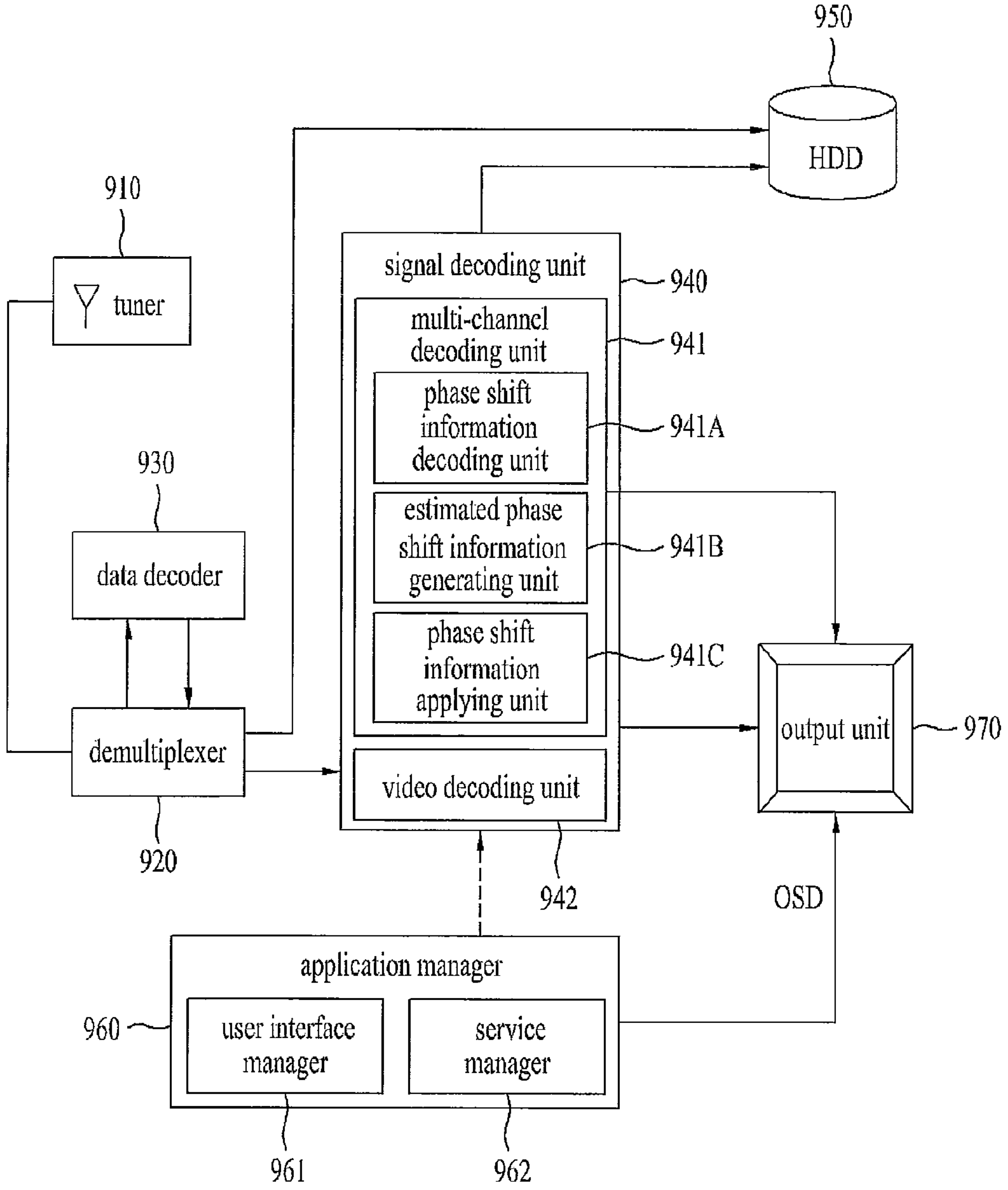
FIG. 9 is a schematic block diagram of a broadcast signal decoding apparatus including a phase shift decoding unit, an estimated phase shift information generating unit and a phase shift information applying unit according to another further embodiment of the present invention.

FIG. 9 is a schematic block diagram of a broadcast signal decoding apparatus 900 including a phase shift decoding unit, an estimated phase shift information generating unit and a phase shift information applying unit according to another further embodiment of the present invention.

Referring to FIG. 9, a demultiplexer 920 receives a plurality of data related to a TV broadcast from a tuner 910. The received data are separated by the demultiplexer 920 and are then decoded by a data decoder 930. Meanwhile, the data separated by the demultiplexer 920 can be stored in such a storage medium 950 as an HDD.

The data separated by the demultiplexer 920 are inputted to a signal decoding unit 940 including a multi-channel decoding unit 941 and a video decoding unit 942 to be decoded into an audio signal and a video signal. The multi-channel decoding unit decoder 941 includes a phase shift information decoding unit 941A, an estimated phase shift information generating unit 941B and a phase shift information applying unit 941C according to one embodiment of the present invention. They have the same configurations and functions of the former units of the same names shown in FIG. 4 and their details are omitted in the following description.

The signal decoding unit 941 decodes a signal using the received phase shift information, the stereo signal, the estimated phase shift information and the like. If a video signal is inputted, the signal decoding unit 941 decodes and outputs the video signal. If metadata is generated, the signal decoding unit 941 outputs the metadata in a text type.

An output unit 970 displays the video signal outputted from the video decoding unit 942 and the preset metadata outputted from the audio decoding 941. The output unit 970 includes a speaker unit (not shown in the drawing) and outputs a phase shift stereo signal, in which a phase of at least one channel of a stereo signal outputted from the audio decoding unit 941 has been shifted, via the speaker unit. Moreover, the data decoded by the signal decoding unit 940 can be stored in a storage medium 950 such as an HDD.

Meanwhile, the signal decoding apparatus 900 can further include an application manager 960 capable of controlling a plurality of data received by having information inputted from a user.

The application manager 960 includes a user interface manager 961 and a service manager 962. The user interface manager 961 controls an interface for receiving an input of information from a user. For instance, the user interface manager 961 is able to control a font type of text displayed on the output unit 970, a screen brightness, a menu configuration and the like.

Meanwhile, if a broadcast signal is decoded and outputted by the signal decoding unit 940 and the output unit 970, the service manager 962 is able to control a received broadcast signal using information inputted by a user. For instance, the service manager 962 is able to provide a broadcast channel setting, an alarm function setting, an adult authentication function, etc. The data outputted from the application manager 960 are usable by being transferred to the output unit 970 as well as the signal decoding unit 940.

Accordingly, as a signal processing apparatus of the present invention is included in a real product, a signal sound quality is improved better than that of the related art for a stereo signal upmixed using spatial information only. Moreover, a user is able to listen to a signal closer to a phase shift stereo signal that is an original input signal.

The present invention applied decoding/encoding method can be implemented in a program recorded medium as computer-readable codes. And, multimedia data having the data structure of the present invention can be stored in the computer-readable recoding medium. The computer-readable recording media include all kinds of storage devices in which data readable by a computer system are stored. The computer-readable media include ROM, RAM, CD-ROM, magnetic tapes, floppy discs, optical data storage devices, and the like for example and also include carrier-wave type implementations (e.g., transmission via Internet). And, a bitstream generated by the encoding method is stored in a computer-readable recording medium or can be transmitted via wire/wireless communication network.

Accordingly, the present invention provides the following effects or advantages.

First of all, according to an apparatus and method of processing a signal of the present invention, it is able to efficiently reproduce a phase or delay difference, which is difficult to be efficiently reproduced by a decorrelator, in a manner of shifting a phase of a decoded audio or speech signal based on phase shift information.

Secondly, according to an apparatus and method of processing a signal of the present invention, a phase shift is enabled to fit each parameter band of a stereo signal with raised coding efficiency in a manner of applying estimated phase shift information, which is generated using interpolation and smoothing schemes in a frequency domain, to phase shift information received from an encoding unit and phase shift information together.

The invention claimed is:

1. A method of processing a signal, comprising:

receiving a low frequency downmix signal including a multi channel signal, phase shift information and spatial information corresponding to parameter band of the low frequency downmix signal;

generating a multi channel signal by applying the spatial information to a whole frequency downmix signal, the whole frequency downmix signal including the low frequency downmix signal and a reconstructed high frequency downmix signal from the low frequency downmix signal;

generating estimated phase shift information corresponding to a parameter band by using the phase shift information, the parameter band being not corresponded to the phase shift information; and generating a phase shift multi channel signal by shifting a phase of the multi channel signal based on the phase shift information and the estimated phase shift information.

2. The method of claim 1, wherein the phase shift multi channel signal is shifted by the parameter band of channel of the multi channel signal.

3. The method of claim 1, wherein the estimated phase shift information is generated by interpolation and smoothing in a frequency domain based on a number of the parameter band and the phase shift information.

4. The method of claim 1, wherein the phase shift information includes at least one of phase values corresponding to the parameter band.

5. The method of claim 1, wherein the generating the multi channel signal includes generating interpolated spatial information on a time unit of the whole frequency downmix signal by interpolating the spatial information in a time domain, the time unit being not corresponding to the spatial information; and applying the spatial information and the interpolated spatial information to the whole frequency downmix signal.

6. The method of claim 1, wherein the phase shift multi channel signal is shifted the phase of a right channel of the multi channel signal by $\pi/2$.

7. The method of claim 1, wherein the phase shift multi channel signal is shifted the phased of at least one channel by a same phase for a whole frequency band.

8. The method of claim 1, wherein the whole band downmix signal is reconstructed by using the entire or a portion of the low frequency downmix signal.

9. An apparatus of processing a signal, comprising:

a signal receiving unit receiving a low frequency downmix signal including a multi channel signal, phase shift information and spatial information corresponding to parameter band of the low frequency downmix signal;

an upmixing unit generating the multi channel signal by applying the spatial information based on the parameter band to a whole frequency downmix signal, the whole frequency downmix signal being reconstructed a downmix signal in a high frequency region from the low frequency downmix signal;

an estimated phase shift information generating unit generating estimated phase shift information of a parameter band by using the phase shift information, the parameter band being not corresponded to the phase shift information; and a phase shift information applying unit generating a phase shift multi channel signal by shifting a phase of the multi channel signal based on the phase shift information and the shifted phase shift information.

10. The apparatus of claim 9, wherein the estimated phase shift information generating unit generates the estimated phase shift information by interpolation and smoothing in a frequency domain based on a number of the parameter band and the phase shift information.

11. The apparatus of claim 9, wherein the phased shift multi channel signal is shifted by the parameter band of channel of the multi channel signal.

12. The apparatus of claim 9, wherein the phase shift information includes at least one of phase values corresponding to the parameter band.

13. The apparatus of claim 9, wherein the phase shift multi channel signal is shifted the phase of a right channel of the multi channel signal by $\pi/2$.

14. A method of processing a signal, comprising:

receiving a phase shift multi channel signal being twisted phases of channels of the phase shift multi channel signal;

extracting phase shift information indicating phase difference between the channels by a parameter band of the phase shift multi channel signal;

generating a multi channel signal being shifted a phase of at least one channel of the phase shift multi channel signal;

generating spatial information indicating an attribute of the multi channel signal;

generating a whole frequency downmix signal by downmixing the multi channel signal; and generating a low frequency downmix signal by eliminating the multi channel signal in a high frequency region from the whole frequency downmix signal.

15. An apparatus of processing a signal, comprising:

a signal receiving unit receiving a phase shift multi channel signal being twisted phases of channels of the phase shift multi channel signal;

a phase shift information extracting unit extracting phase shift information indicating phase difference between the channels by a parameter band of the phase shift multi channel signal;

a signal modification unit generating a multi channel signal being shifted a phase of at least one channel of the phase shift multi channel signal;

a downmixing unit generating spatial information indicating an attribute of the multi channel signal and generating a whole frequency downmix signal by downmixing the multi channel signal; and a bandwidth extension signal encoding unit generating a low frequency downmix signal by eliminating the multi channel signal in a high frequency region from the whole frequency downmix signal.

* * * * *